(12) United States Patent
Kimura

(10) Patent No.: US 6,472,759 B1
(45) Date of Patent: Oct. 29, 2002

(54) BALL GRID ARRAY TYPE SEMICONDUCTOR DEVICE

(75) Inventor: Naoto Kimura, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/686,808

(22) Filed: Oct. 12, 2000

(30) Foreign Application Priority Data

Oct. 19, 1999 (JP) ............................................ 11-296898

(51) Int. Cl.[7] ...................... H01L 23/48; H01L 23/52; H01L 29/40; H01L 21/44
(52) U.S. Cl. ...................... 257/777; 257/778; 257/779; 257/780; 257/781; 438/614
(58) Field of Search ................................. 252/704–707, 252/710, 778–780, 783, 772, 779, 781

(56) References Cited

U.S. PATENT DOCUMENTS 6,177,731 B1 * 1/2001 Ishida et al. ................. 257/780
6,288,445 B1 * 9/2001 Kimura ....................... 257/737

* cited by examiner

*Primary Examiner*—Jerome Jackson
*Assistant Examiner*—Shrinivas H. Rao
(74) *Attorney, Agent, or Firm*—Young & Thompson

(57) ABSTRACT

A BGA type semiconductor device having a high reliability when mounted on a printed circuit board by preventing cracks and breakage of weld balls of the BGA type semiconductor device. The semiconductor device includes a conductive board having a pair of terminals, a relay terminal and an external terminal, arranged at a distance from each other and on different surfaces of the conductive board. The relay terminal serves as a connection terminal formed on a wiring board. Moreover, a slit 7 is provided around the terminals provided on the conductive board.

7 Claims, 4 Drawing Sheets

BALL GRID ARRAY TYPE SEMICONDUCTOR DEVICE

BACKGROUND OF THE INVENTION

1. Field of the Invention

The present invention relates to a semiconductor device and in particular, to a ball grid array (BGA) type semiconductor device.

2. Description of the Related Art

Recently, the electronic apparatuses having a built-in semiconductor device are becoming thinner and smaller in size and it has become necessary to reduce the thickness and size of the semiconductor device to be built in those electronic apparatuses. To cope with this, a ball grid array (BGA) type semiconductor device is now beginning to be used in practice.

FIG. 6 is a cross sectional view of a conventional BGA semiconductor device mounted on a printed circuit board. As shown in FIG. 6, in the conventional BGA type semiconductor device, a semiconductor chip 11 is mounted on a wiring substrate 12 made from an organic resin or ceramic as a main material, and a bonding wire 13 connects a bonding pad (not depicted) of the semiconductor chip 11 to a conductive wiring (not depicted) formed on a surface of the wiring substrate 12 where the semiconductor chip 11 is mounted. A seal resin 14 covers the semiconductor chip 11 and the bonding wire 13 on the wiring substrate 12. Weld balls 16 as external terminals are arranged on a lattice shape on the land 15 as connection terminals connected to the aforementioned conductive wiring formed on the opposite surface of the wiring substrate 12 not having the semiconductor chip 11. It should be noted that the connection between the bonding pad (not depicted) of the semiconductor chip 11 and the conductive wiring (not depicted) formed on the wiring substrate 12 is not limited to the connection using the bonding wire 13. The connection may also be a flip chip connection using a bump electrode formed on the bonding pad (not depicted) of the semiconductor chip 11.

As can be seen from the cross sectional view of the BGA type semiconductor device mounted on the printed circuit board of FIG. 6, in the aforementioned conventional BGA type semiconductor device, the weld balls 16 serving as external terminals provided on the wiring substrate 12 of the BGA type semiconductor device thermally attached to the land (connection terminal) 22 formed on the mounting surface of the printed circuit board 21 by using the reflow method or the like. Here, a difference is present between the thermal expansion coefficients of the wiring substrate 12 of the BGA type semiconductor device and the printed circuit board 21. Accordingly, a stress is caused by the thermal expansion difference during heating and the thermal shrinking difference during cooling. The stress is concentrated in the weld balls 16 of the BGA type semiconductor device as junction portions and the weld balls 16 are cracked or broken. That is, a junction failure is caused.

SUMMARY OF THE INVENTION

It is therefore an object of the present invention to provide a BGA type ;semiconductor device capable of preventing a junction failure due to cracks and breakage of the weld balls of the BGA type semiconductor device when mounted on the printed circuit board, thus increasing the reliability of mounting on the printed circuit board.

The semiconductor device according to the present invention comprises: a wiring board having on its first surface a conductive wiring and on its second surface a connection terminal connected to the conductive wiring; a semiconductor chip mounted on the first surface of the wiring board and electrically connected to the conductive wiring; a sealing resin for sealing the semiconductor chip; and a conductive board having a pair of terminals arranged at a distance and on different surfaces of the conductive board, wherein one of the terminals provided on the conductive board is connected to the connection terminal formed on the wiring board and the other of the terminals provided on the conductive board serves as an external terminal.

Moreover, the device further comprises: an insulation tape on which a plurality of the conductive boards are arranged; and an insulation cover for the surface of the conductive board not facing the insulation tape, wherein the pair of terminals arranged on the conductive board protrude through the insulation tape or the insulation cover. The plurality of conductive boards arranged on the insulation tape are located to correspond to positions of the plurality of connection terminals formed on the wiring board.

Moreover, a slit is provided through the insulation tape and the conductive board around the terminals arranged on the conductive board.

Moreover, the device further comprises insulation covers covering both surfaces of the conductive board, wherein the pair of terminals arranged on the conductive board protrudes through the insulation covers. A plurality of the conductive boards are arranged to correspond to positions of a plurality of the connection terminals formed on the wiring board.

Moreover, the pair of terminals arranged on the conductive board are weld balls and the conductive board is connected to the wiring board by reflow.

According to this invention, one of the terminals arranged on the conductive board and connected to the connection terminal formed on the wiring board is arranged apart from the other of the terminals arranged on the conductive board to serve as an external terminal. Moreover, a slit is provided around the terminals provided on the conductive board.

DESCRIPTION OF THE PREFERRED EMBODIMENTS

Figure 1:
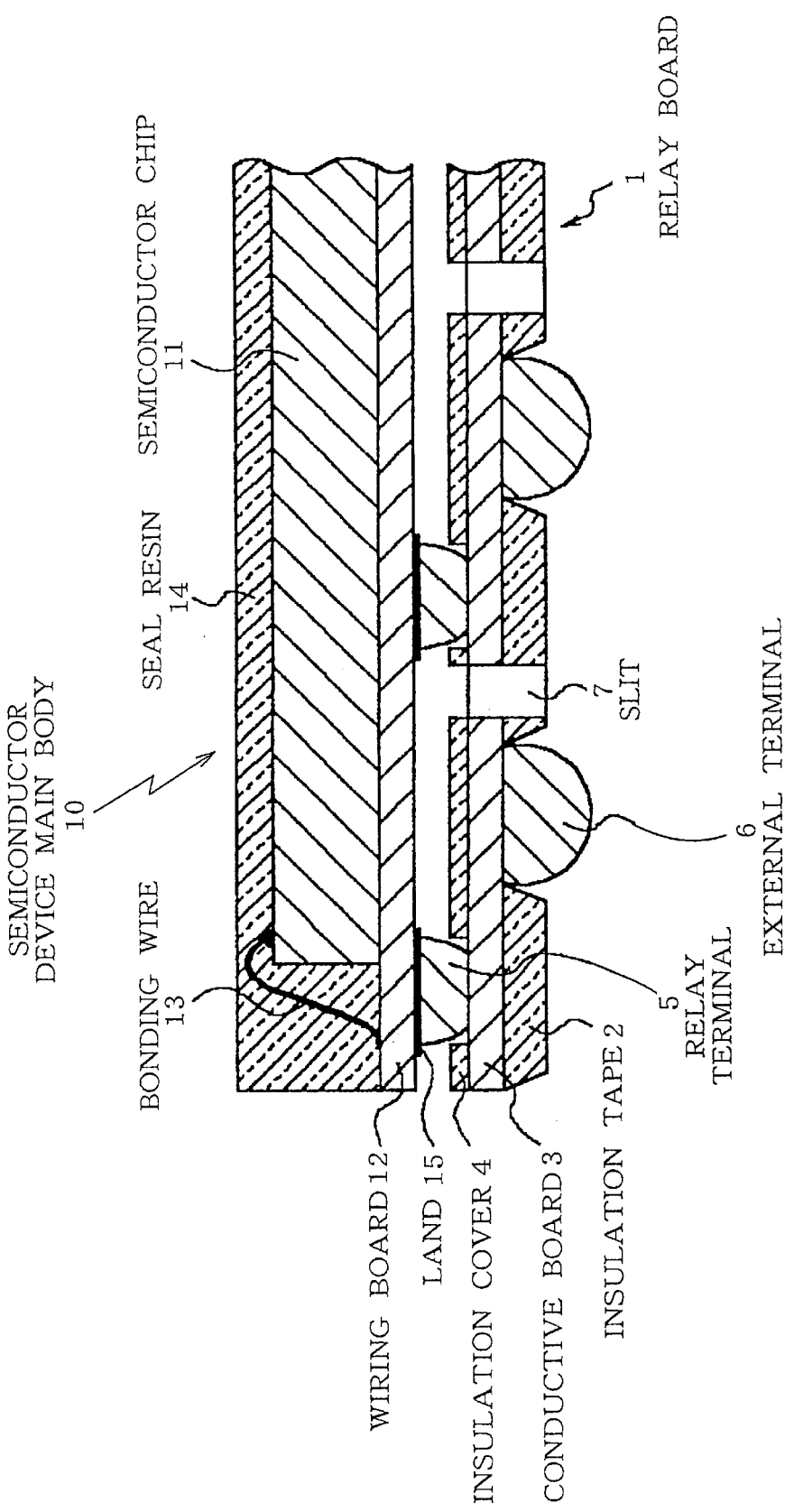
FIG. 1 is a partial cross sectional view of a semiconductor device according to a first embodiment of the present invention.

Description will now be directed to embodiments of the present invention with reference to the attached drawings. FIG. 1 is a partial cross sectional view of a first embodiment of the present invention, FIG. 2 is partial bottom view of FIG. 1, and FIG. 3 is a partial cross sectional view of FIG. 1.

As shown in FIG. 1, the BGA type semiconductor device according to the present embodiment includes a semiconductor device main body 10 and a relay board 1. The semiconductor device main body 10 includes a semiconductor chip 11 mounted on a wiring board 12 made from an organic resin or ceramic and a bonding wire 13 connecting a bonding pad (not depicted) of the semiconductor 11 to a conductive wiring formed on the surface of the wiring board having the semiconductor chip 11. The semiconductor chip 11 and the bonding wire 13 on the wiring board 12 are sealed by a seal resin 14. The relay board 1 is connected to lands 15 serving as connection terminals connected to the conductive wiring formed on the opposite side of the wiring board 12 not having the semiconductor chip 11.

Figure 2:
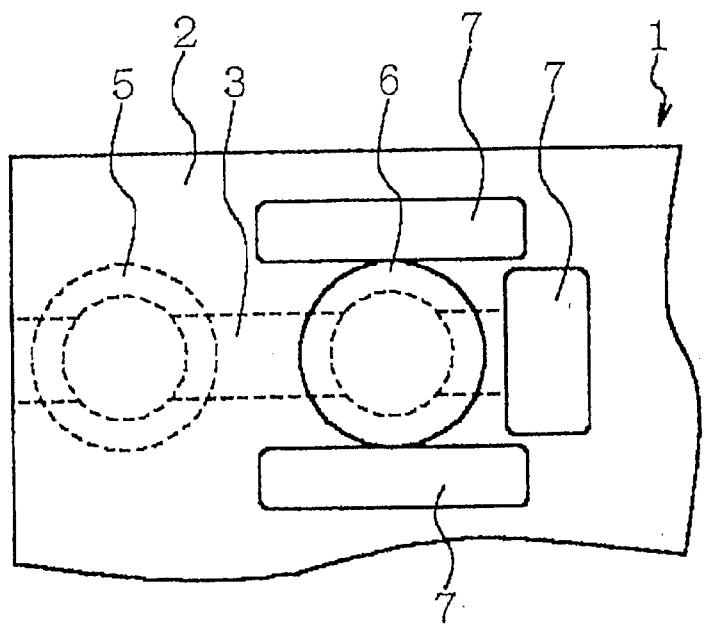
FIG. 2 is partial-bottom view of FIG. 1.
Figure 3:
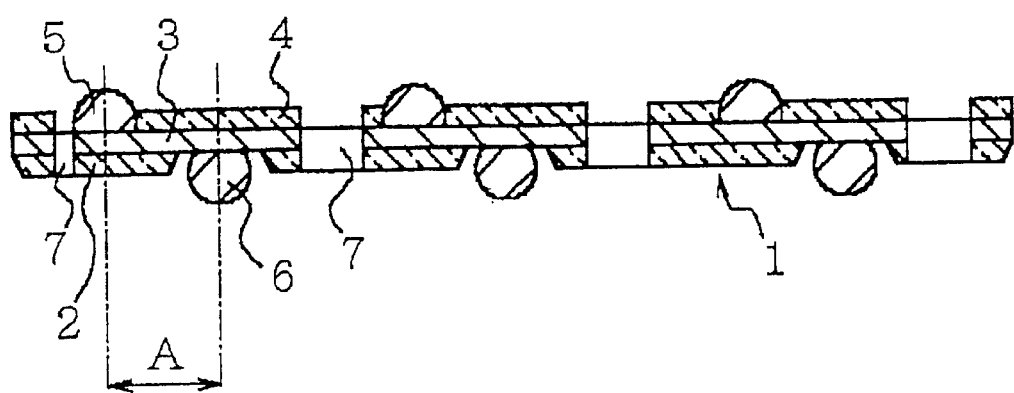
FIG. 3 is a partial cross sectional view of FIG. 1.

As shown in FIG. 1, FIG. 2, and FIG. 3, the relay board 1 has a size almost identical to that of the semiconductor device main body 1 and includes an insulation tape 2 as a main member. A plurality of patterned conductive boards 3 are attached to one side of the insulation tape 2. On the opposite side of the conductive board 3 not having the insulation tape 2, there is provided an insulation cover 4. The conductive board 3 is sandwiched by a pair of a relay terminal 5 and an external terminal 6 arranged at a distance A shown in FIG. 3. The relay terminals 5 connect the relay board 1 to the lands 15 formed on the wiring board 12 of the semiconductor device main body 10. Each of the relay terminals 5 protrudes from the conductive board 3 where the insulation cover 4 is removed. Moreover, the external terminals 6 are used for mounting the relay board 1, i.e., the BGAt semiconductor device itself on a printed circuit board., Each of the external terminals 6 protrudes from the conductive board 3 where the insulation tape is removed. Each of the conductive boards 3 provided on the relay board 1 is provided corresponding to a position of the land 15 formed on the wiring board 12 of the semiconductor device main body 10.

Here, the insulation tape 2 is preferably a polyimide resin tape or an organic resin tape having a thickness of 30 to 50 micrometers. The conductive board 3 is preferably a metal plate such as copper plate having a thickness of 10 to 30 micrometers. The insulation cover 4 is preferably an insulating resin resist having a thickness of 1 to 5 micrometers and provided by the coating method, for example.

The relay terminal 5 and the external terminal 6 are preferably weld balls having a diameter of 30 to 800 micrometers arranged in a hemispheric shape on the conductive board 3.

Moreover, in the relay board, a pair of the relay terminal 5 and the external terminal 6 is isolated by slits 7 formed through the insulation tape 2 and the conductive board 3.

The relay board 1 is connected to the semiconductor device main body 10 by the reflow method, for example, in such a manner that the relay terminals 5 provided on the relay board 1 are matched with the positions of the lands formed on the wiring board 12 of the semiconductor device main body 10.

Figure 4:
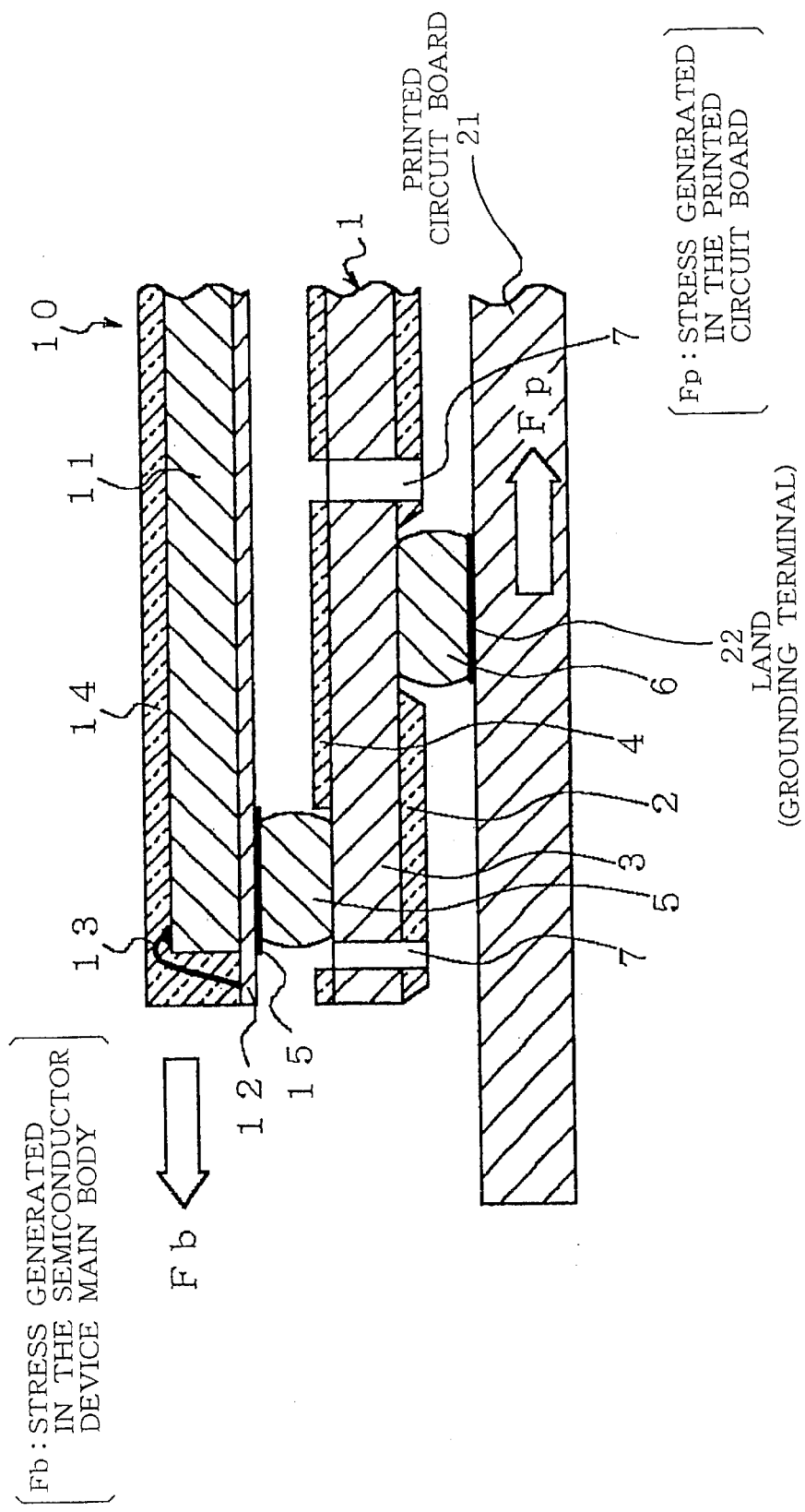
FIG. 4 is a partial cross sectional view of the semiconductor device of the first embodiment mounted on a printed circuit board.

As shown in FIG. 4, the BGA type semiconductor device including the semiconductor device main body 10 and the relay board 1 electrically connected to the semiconductor device main body 10 according to the present embodiment is mounted on a printed circuit board 21 in such a manner that the weld balls as the external terminals 6 provided on the relay board 1 are heated and attached to lands (connection terminals) 22 formed on the mounting side of the printed circuit board 21.

Figure 5:
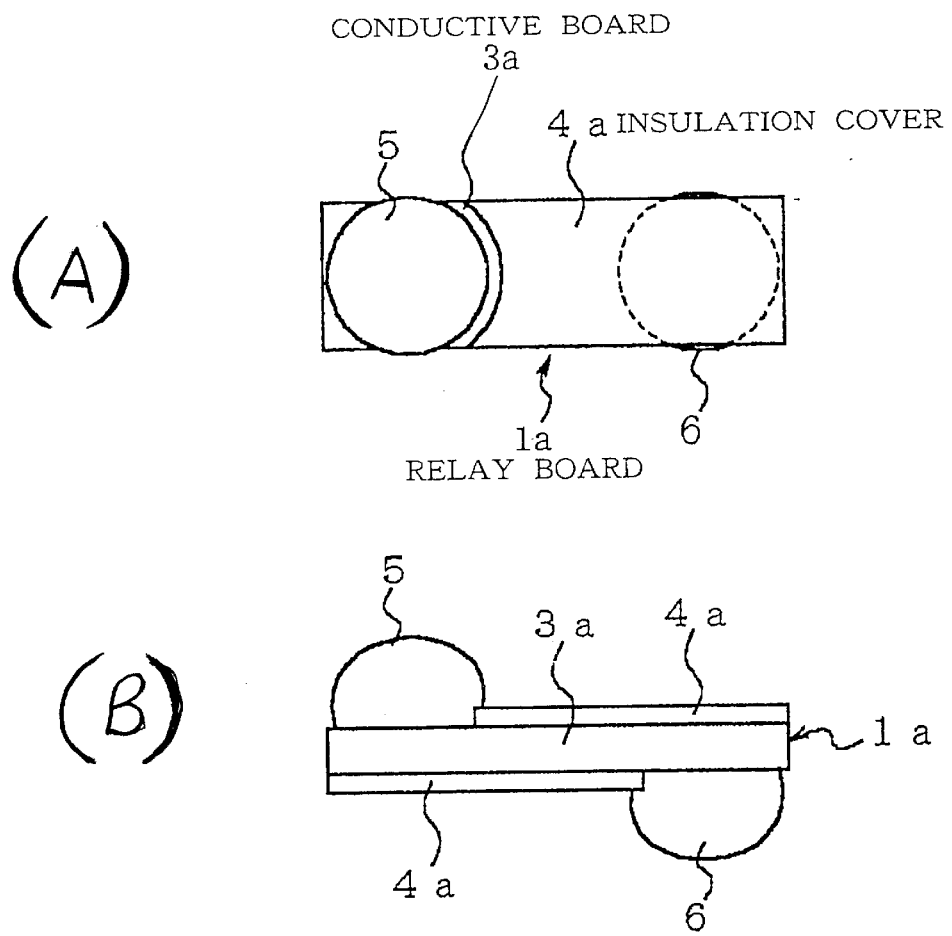
FIG. 5(a) is a plan view and FIG. 5(b) is a side view of a semiconductor device according to a second embodiment of the present invention.
Figure 6:
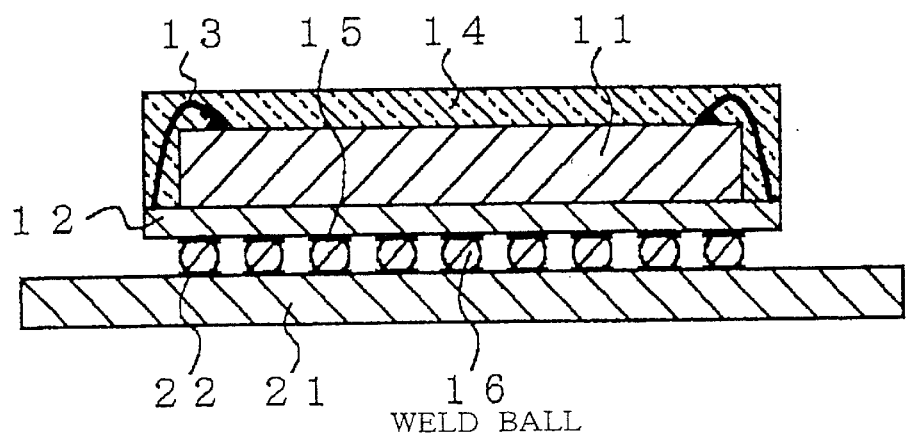
FIG. 6 is a cross sectional view explaining the conventional technique.

FIG. 5(a) is a plan view and FIG. 5(b) is a side view of a relay board 1a according to a second embodiment of the present invention. The BGA type semiconductor device according to the present embodiment includes the semiconductor device main body 10 and a plurality of relay boards 1a electrically connected to the semiconductor main body 10. As shown in FIG. 5(b), in the BGA type semiconductor/device according to the present embodiment, the relay board 1a includes a patterned conductive board 3a sandwiched by a pair of relay terminal 5 and an external terminal 6 which are located at a distance. The conductive board 3a is also sandwiched by insulation covers 4a, except for the portions where the relay terminal 5 and the external terminal 6 protrude.

Unlike the first embodiment, the conductive board 3a is preferably a metal plate such as a copper plate having a thickness of 20 to 50 micrometers.

The plurality of relay boards 1a are connected to the semiconductor device main body 10 by the reflow method, for example, in such a manner that the relay terminals 5 provided on the respective relay boards 1a are matched with the corresponding lands 15 formed on the wiring board 12 of the semiconductor device main body 10.

In the present embodiment, the wiring board 12 of the semiconductor device main body 10 is made from an organic resin or ceramic. However, the present invention is not to be limited to this and the wiring board 12 may be a TAB tape.

As has been described above, according to the present invention, in the BGA type semiconductor device mounted on a printed circuit board, the relay terminals (weld balls) connected to the lands formed on the semiconductor device main body and the external terminals (weld balls) connected to the lands formed on the printed circuit boards are arranged at a distance. Accordingly, as shown in FIG. 4, when the BGA type semiconductor device is mounted on the printed circuit board, stress Fp generated in the printed circuit board and the stress Fb generated in the semiconductor device main body are dispersed to the relay terminals (weld balls) and the external terminals (weld balls). That is, the stress applied to each of the relay terminals (weld balls) and the external terminals (weld balls) is reduced.

Moreover, a pair of the relay terminal (weld ball) and the external terminal (weld ball) is isolated by a slit. When the BGA type semiconductor device is mounted on a printed circuit board, the slits provided in the relay board absorb stress generated by thermal expansion and shrinkage, thus reducing the stress applied to the relate terminals (weld balls) and the external terminals (weld balls). In the BGA type semiconductor device in which a plurality of relay boards are connected to the lands formed on the semiconductor device main body, each of the relay boards is connected independently of one another and accordingly, it is possible to obtain the same effect as when slits surround the respective relay boards.

Thus, according to the present invention, it is possible to reduce the stress applied to the relay terminals (weld balls) and the external terminals (weld balls) provided on the relay board. Accordingly, when mounting the BGA type semiconductor device on a printed circuit board, it is possible to prevent junction failure due to cracks and breakage of the weld balls of the BAG type semiconductor device.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 11-296898 (Filed on Oct. 19th, 1999) including specification, claims, drawings and summary are incorporated herein by reference in its entirety.

What is claimed is:

1. A semiconductor device comprising:
   a wiring board having on its first surface a conductive wiring and on its second surface a connection terminal connected to the conductive wiring;
   a semiconductor chip mounted on the first surface of the wiring board and electrically connected to the conductive wiring;
   a sealing resin for sealing the semiconductor chip;
   a conductive board having a thickness of 10 to 30 micrometers and;
   having a pair of terminals arranged at a distance and on different surfaces of the conductive board, wherein one of the terminals provided on the conductive board is connected to the connection terminal formed on the wiring board and the other of the terminals provided on the conductive board serves as an external terminal;
   an insulation tape having a thickness of 30 to 50 micrometers, on which a plurality of the conductive boards are arranged; and
   an insulation cover having a thickness of 1 to 5 micrometers, for the surface of the conductive board not facing the insulation tape,
   wherein the pair of terminals arranged on the conductive board protude through the insulation tape or the insulation cover.

2. A semiconductor device as claimed in claim 1, wherein the plurality of conductive boards arranged on the insulation tape are located to correspond to positions of the plurality of connection terminals formed on the wiring board.

3. A semiconductor device comprising:
   a wiring board having on its first surface a conductive wiring and on its second surface a connection terminal connected to the conductive wiring;
   a semiconductor chip mounted on the first surface of the wiring board and electrically connected to the conductive wiring;
   a sealing resin for sealing the semiconductor chip;
   a conductive board having a thickness of 10 to 30 micrometers and;
   having a pair of terminals arranged at a distance and on different surfaces of the conductive board, wherein one of the terminals provided on the conductive board is connected to the connection terminal formed on the wiring board and the other of the terminals provided on the conductive board serves as an external terminal;
   an insulation tape having a thickness of 30 to 50 micrometers, on which a plurality of the conductive boards are arranged; and
   an insulation cover having a thickness of 1 to 5 micrometers, for the surface of the conductive board not facing the insulation tape,
   wherein the pair of terminals arranged on the conductive board protude through the insulation tape or the insulation cover and
   wherein a slit is provided through the insulation tape and the conductive board around the terminals arranged on the conductive board.

4. A semiconductor device as claimed in claim 1, the device further comprising insulation covers covering both surfaces of the conductive board, wherein the pair of terminals arranged on the conductive board protrudes through the insulation covers.

5. A semiconductor device as claimed in claim 4, wherein a plurality of, the conductive boards are arranged to correspond to positions of a plurality of the connection terminals formed on the wiring board.

6. A semiconductor device as claimed in claim 1, wherein the pair of terminals arranged on the conductive board are weld balls and the conductive board is connected to the wiring board by reflow.

7. A semiconductor device comprising:
   a wiring board having on its first surface a conductive wiring and on its second surface a connection terminal connected to the conductive wiring;
   a semiconductor chip mounted on the first surface; and
   a conductive board having a thickness of 1 to 5 micrometers and, having a first terminal directly connected to a first side of the conductive board and a second terminal directly connected to an opposite second side of the conductive board, said first terminal being connected to the connection terminal and said second terminal being an external terminal;
   an insulation tape having a thickness of 30 to 50 micrometers, on which a plurality of the conductive boards are arranged; and
   an insulation cover having a thickness of 1 to 5 micrometers, for the surface of the conductive board not facing the insulation tape.

* * * * *